US012563762B2

(12) United States Patent
Wang

(10) Patent No.: US 12,563,762 B2
(45) Date of Patent: Feb. 24, 2026

(54) SEMICONDUCTOR DEVICE AND METHOD FOR MANUFACTURING THE SAME

(71) Applicant: Silergy Semiconductor Technology (Hangzhou) LTD, Hangzhou (CN)

(72) Inventor: Huan Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 557 days.

(21) Appl. No.: 18/080,870

(22) Filed: Dec. 14, 2022

(65) Prior Publication Data

US 2023/0207666 A1 Jun. 29, 2023

(30) Foreign Application Priority Data

Dec. 28, 2021 (CN) .......................... 202111625718.6

(51) Int. Cl.
| | |
|---|---|
| *H10D 30/01* | (2025.01) |
| *H01L 21/762* | (2006.01) |
| *H10D 30/65* | (2025.01) |
| *H10D 62/10* | (2025.01) |

(52) U.S. Cl.
CPC ... *H10D 30/0281* (2025.01); *H01L 21/76235* (2013.01); *H10D 30/65* (2025.01); *H10D 62/116* (2025.01)

(58) Field of Classification Search
CPC .. H10D 30/0281; H10D 30/65; H10D 62/116; H10D 30/603; H10D 10/061; H10D 12/411; H10D 62/142; H10D 54/516; H01L 21/76235; H01L 21/76224; H01L 21/76232; H01L 21/76202
See application file for complete search history.

(56) References Cited

U.S. PATENT DOCUMENTS

| | | | |
|---|---|---|---|
| 8,716,795 B2 | 5/2014 | You | |
| 8,912,600 B2 | 12/2014 | You | |
| 10,985,052 B2 | 4/2021 | Wang | |
| 11,133,413 B2 | 9/2021 | Han | |
| 11,251,276 B2 | 2/2022 | Wang et al. | |
| 2007/0026629 A1* | 2/2007 | Chen ................... | H10D 62/364 |
| | | | 257/E21.624 |

(Continued)

FOREIGN PATENT DOCUMENTS

| | | |
|---|---|---|
| CN | 105280642 A | 9/2014 |
| CN | 104347470 A | 2/2015 |
| CN | 111244178 A | 1/2020 |

*Primary Examiner* — Galina G Yushina

(57) ABSTRACT

A method of manufacturing a semiconductor device having a combination structure of a horizontal oxide layer structure and a vertical oxide layer structure, can include: etching from an upper surface of the semiconductor substrate to inside of the semiconductor substrate to form a trench; depositing oxides in the trench to form the vertical oxide layer structure; etching the vertical oxide layer structure from an upper surface thereof to decrease height of the vertical oxide layer structure, and to make a top surface of the vertical oxide layer structure be below the upper surface of the semiconductor substrate, in order to expose side surfaces of the trench; and forming, by an oxidation process, the horizontal oxide layer structure to cover part of the upper surface of the semiconductor substrate and the upper surface of the vertical oxide layer structure.

11 Claims, 6 Drawing Sheets

(56)     References Cited

U.S. PATENT DOCUMENTS

| | | | |
|---|---|---|---|
| 2015/0364333 A1* | 12/2015 | Chen ................. | H01L 21/76224 |
| | | | 257/329 |
| 2016/0005640 A1* | 1/2016 | Shinohara ............ | H10D 62/116 |
| | | | 438/425 |
| 2020/0006529 A1* | 1/2020 | Qi ..................... | H01L 21/02274 |
| 2021/0217878 A1* | 7/2021 | Wang .................. | H10D 30/603 |

* cited by examiner

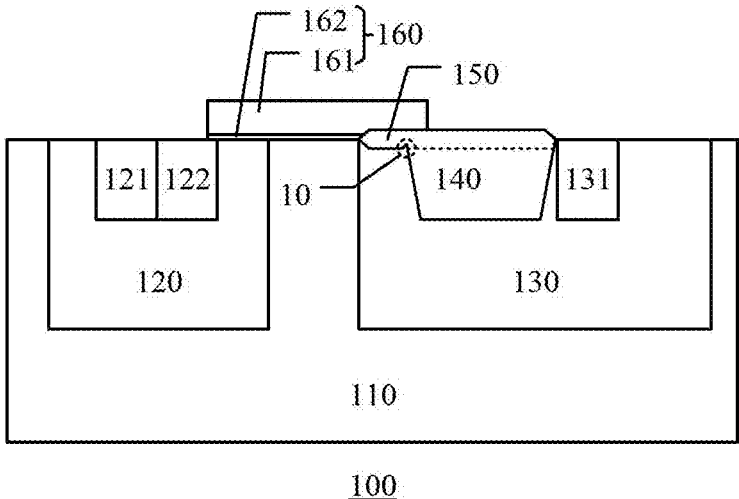
FIG. 1 (conventional)
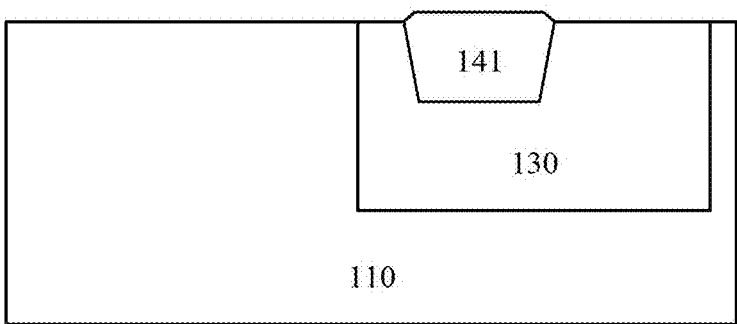
FIG. 2A (conventional)

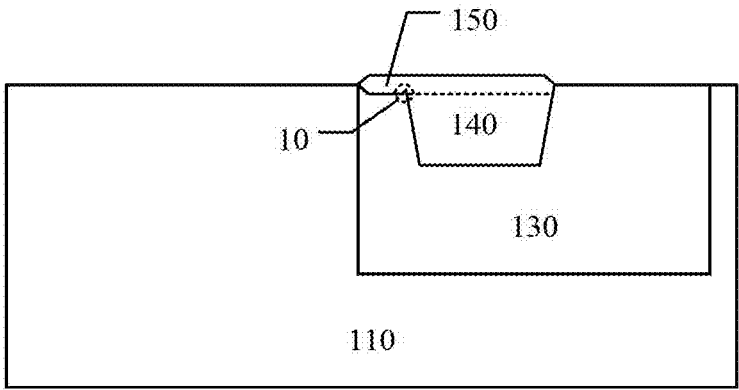
FIG. 2B (conventional)
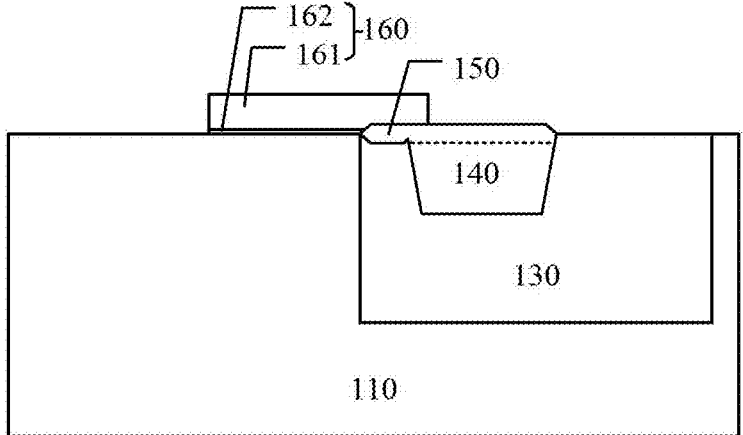
FIG. 2C (conventional)

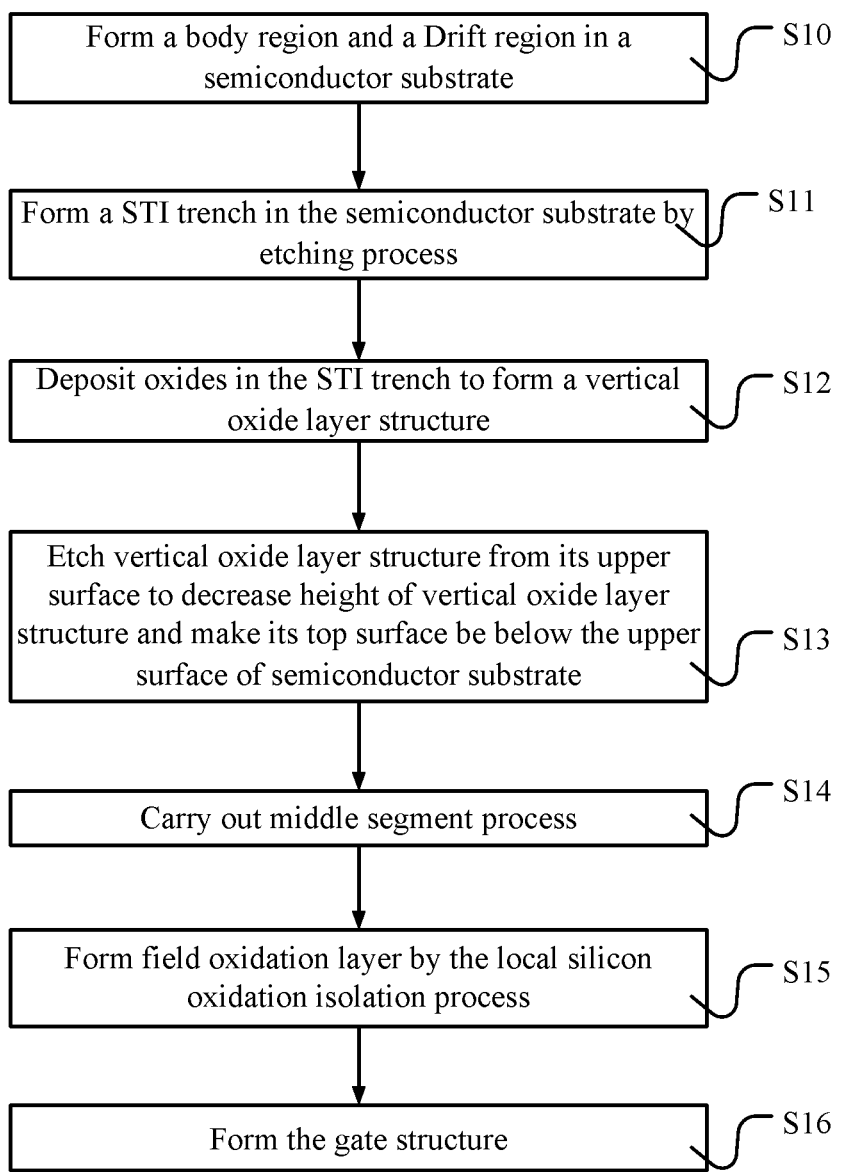

| Form a body region and a Drift region in a semiconductor substrate | S10 |

| Form a STI trench in the semiconductor substrate by etching process | S11 |

| Deposit oxides in the STI trench to form a vertical oxide layer structure | S12 |

| Etch vertical oxide layer structure from its upper surface to decrease height of vertical oxide layer structure and make its top surface be below the upper surface of semiconductor substrate | S13 |

| Carry out middle segment process | S14 |

| Form field oxidation layer by the local silicon oxidation isolation process | S15 |

| Form the gate structure | S16 |

FIG. 3

SEMICONDUCTOR DEVICE AND METHOD FOR MANUFACTURING THE SAME

RELATED APPLICATIONS

This application claims the benefit of Chinese Patent Application No. 202111625718.6, filed on Dec. 28, 2021, which is incorporated herein by reference in its entirety.

FIELD OF THE INVENTION

The present invention generally relates to the field of semiconductor technology, and more particularly to semiconductor devices and methods of manufacturing the semiconductor devices.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads. Power switches can be semiconducting devices, including metal-oxide-semiconductor field-effect transistors (MOSFETs) and insulated gate bipolar transistors (IGBTs), among others. For example, laterally diffused metal oxide semiconductor (LDMOS) devices are widely used in such on-off type regulators.

BRIEF DESCRIPTION OF THE DRAWINGS

FIG. 1 is a structural diagram of an example LDMOS device.

FIGS. 2A-2C are structural diagrams of partial processes of a manufacturing method of an example LDMOS device.

FIG. 3 is a flow diagram of an example manufacturing method of the semiconductor device, in accordance with embodiments of the present invention.

DETAILED DESCRIPTION

Figure 4A:
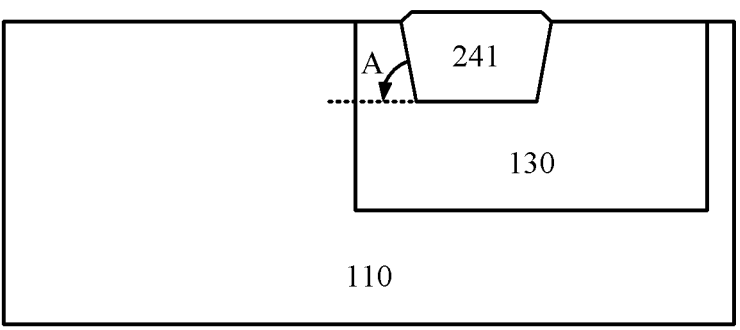
FIGS. 4A-4D are structural diagrams of partial processes of manufacturing a semiconductor device, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that can include pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

Referring now to FIG. 1, shown is a structural diagram of an example LDMOS device. In this particular example, LDMOS device 100 can include semiconductor substrate 110, body region 120, and drift region 130 located in semiconductor substrate 110. Doping regions 121 and 122 can be located in body region 120. Drain region 131 may be located in drift region 130. Shallow trench isolation (STI) region 140 can be located in drift region 130 between drain region 131 and body region 120. Field oxide layer 150 may be located on a upper surface of shallow trench isolation 140. Gate structure 160 can be located on a region extending from second doping region 122 to a drift region 130. Gate structure 160 may include gate oxide layer 162 and polysilicon layer 161 on gate oxide layer 162. Polysilicon layer 161 can also cover the junction between field oxide layer 150 and shallow trench isolation region 140.

In example LDMOS device 100, sharp corner 10 can be formed at the junction between field oxide layer 150 and shallow trench isolation region 140. Sharp corner 10 can reduce the thickness of field oxide layer 150 and reduce breakdown voltage of LDMOS device. Also, sharp corner 10 can aggregate charge, elevate the risk of breakdown of field oxide layer 150, and reduce the performance of LDMOS device 100.

Referring now to FIGS. 2A-2C, shown are structural diagrams of partial processes of a manufacturing method of an example LDMOS device. In FIG. 2A, a shallow trench isolation area of drift region can be etched to form a trench, and oxides may be deposited in the trench to form vertical oxide layer structure 141. An upper surface of vertical oxide layer structure 141 can be higher than an upper surface of semiconductor substrate 110, in order to ensure the isolation effect.

In FIG. 2B, a horizontal oxide layer structure can be formed on a semiconductor substrate including vertical oxide layer structure 141, such as by a local oxidation of silicon (LOCOS) process. The horizontal oxide layer structure may correspond to field oxide layer 150. For example the horizontal oxide layer can be formed by oxidizing inwardly from the upper surface of semiconductor substrate 110. The oxidation process may have insufficient oxidation to the edge part, which may result in forming sharp corner 10 at the junction of field oxide layer 150 and shallow trench isolation region 140.

In FIG. 2C, a source region and a drain region can be formed by ion implantation process after the forming of field oxide layer 150 and shallow trench isolation region 140. Then, gate structure 160 can be formed to complete the manufacture of the main structure of LDMOS device 100, followed by the fabrication of electrode structure and encapsulation. Sharp corner 10 at the junction of field oxide layer 150 and shallow trench isolation region 140 may be difficult to abate in this approach, thereby affecting the breakdown voltage of the LDMOS device.

Referring now to FIG. 3, shown is a flow diagram of an example manufacturing method of the semiconductor device, in accordance with embodiments of the present invention. Referring also to FIGS. 4A-4D, shown are structural diagrams of partial processes of manufacturing a semiconductor device, in accordance with embodiments of the present invention.

In this particular example, the method of manufacturing a semiconductor device can include, at S10, forming a body region and drift region 130 in a semiconductor substrate. The body region may extend from an upper surface of the semiconductor substrate to inside of the semiconductor substrate. Drift region 130 may extend from an upper surface of the semiconductor substrate to inside of the semiconductor substrate. In an n-type LDMOS example, the semiconductor substrates can be, e.g., silicon substrate, gallium substrate or silicon carbide substrate as p-type substrate, the body region can be configured as p-type doped well region, and the drift region as n-type deep well.

At S11, an STI trench can be formed in the semiconductor substrate by an etching process. The STI trench can be formed by an etching process at the shallow trench isolation area of the semiconductor substrate. Side surfaces of the STI trench may be tilted outward, and the inclination angle can be less than or equal to 90 degrees. In another example, the STI trench can be an inverted trapezoid shape with 65 degrees to 70 degrees inclination of its side surfaces.

At S12, oxides can be deposited in the STI trench to form a vertical oxide layer structure. In FIG. 4A, a height of vertical oxide layer structure 241 can be higher than the upper surface of the semiconductor substrate 110, and outward tilting angle A of the STI trench can be, e.g., from 65 to 70 degrees.

Figure 4B:
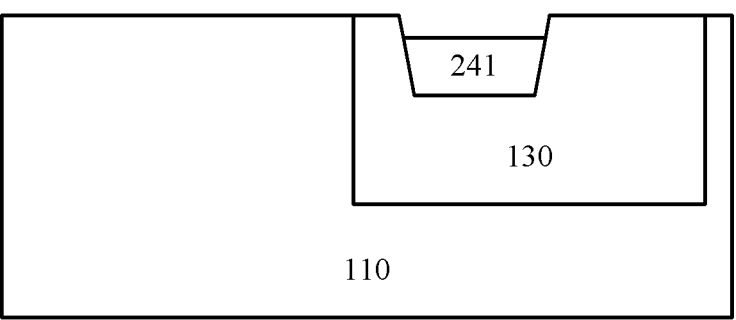

At S13, vertical oxide layer structure 241 can be etched from its upper surface to decrease height of vertical oxide layer structure 241, and to make its top surface be below the upper surface of semiconductor substrate 110. In FIG. 4B, the etching process can be a wet etching process that reduces the upper surface of vertical oxide layer structure 241 to below the upper surface of the semiconductor substrate 110, in order to expose the top side surfaces of the STI trench. The wet etching process may be convenient to maintain the inclination state of side surfaces of the STI trench.

In particular embodiments, the vertical oxide layer structure can be etched to lower the upper surface of the vertical oxide layer structure to below the upper surface of the semiconductor substrate, and to form a sharp corner structure exposing the upper surface and side surfaces at the top edge of the trench. For example, at only one side that whereby the horizontal oxide layer structure extends horizontally beyond the vertical oxide layer structure, a junction between the horizontal oxide layer structure and the vertical oxide layer structure can be smoother than a junction between the upper surface of the semiconductor substrate and the vertical oxide layer structure. Further, in the subsequent oxidation, an upper surface of vertical oxide layer structure 241 can be reduced to a distance from, e.g., 100 Å to 400 Å below the upper surface of semiconductor substrate 110 to guarantee the abatement effect of the sharp corner, and to guarantee the smoothness of the junction between vertical oxide layer structure 241 and the field oxide layer, in order to improve the minimum thickness of field oxide layer (e.g., corresponding to the thickness at the junction structure without considering the thickness effect of its edge bird mouth structure), thereby the reliability of breakdown protection is improved.

Figure 4C:
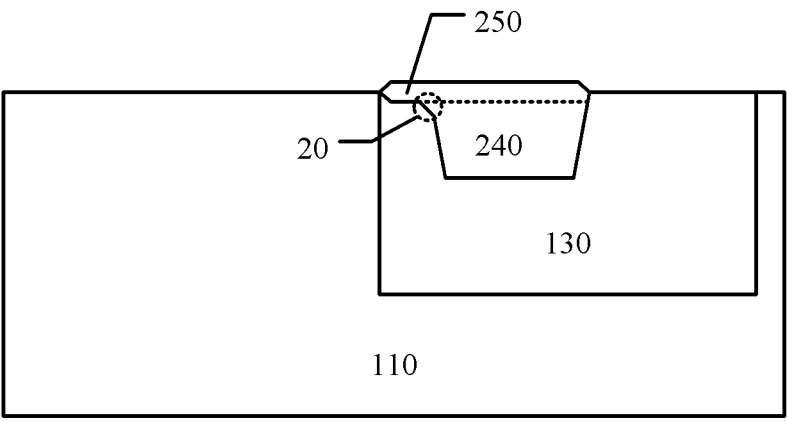

Under ideal conditions, as shown in FIG. 4C, the sharp corner can be completely eliminated, corresponding to the highest point of obtained junction structure 20 coinciding with the level of a lower surface of field oxide layer 250. Junction structure 20 may extend smoothly downward from the highest point, the thickness of field oxide layer 250 at the position of junction structure 20 can gradually increase, without rebound, and the thickness of field oxide layer 250 can be guaranteed.

When the distance from the upper surface of vertical oxide structure 241 to the upper surface of semiconductor substrate 110 is relatively small, it may be difficult to completely reduce the sharp corner at the junction between the horizontal oxide structure and the vertical oxide structure. However, the protruding degree of the sharp corner can be reduced, and the breakdown risk of the field oxide layer brought by sharp corner structure as compared to other approaches can also be reduced. As a result, the breakdown voltage of the semiconductor device can be elevated to a certain extent, and the performance improved.

At S14, the middle segment process can be carried out. For example, the middle stage process can include forming the source region in the body region, and forming the drain region in the drift region by ion implantation process.

At S15, a field oxidation layer can be formed, e.g., by a LOCOS process. For example, a silicon nitride layer can be deposited on the upper surface of semiconductor substrate 110 (e.g., including structures such as source region, drain region, drift region, and body region formed in semiconductor substrate 110) and vertical oxide layer 241. Then, the silicon nitride layer can be etched, and the window area of the etched silicon nitride layer may correspond to the field oxide layer region. The window area can cover the area of vertical oxide layer structure 241. Then, the silicon nitride layer can be used as a mask. A horizontal oxide layer can be formed by the LOCOS process, and the horizontal oxide layer may be configured as field oxide layer structure 250.

At S15, since the above process reduces the height of vertical oxide layer structure 241 such that the silicon material at both the upper surface and the side surfaces at boundary of trench are exposed, the exposed upper surface and side surfaces can be simultaneously oxidized in a high-pressure gate oxygen furnace tube oxidation. The sharp corner at the junction between field oxide layer 250 and shallow trench isolated region 240 can be reduced to obtain smooth junction structure 20, as shown in FIG. 4C. The thickness of field oxide layer 250 can effectively be increased, and the breakdown risk due to the charge aggregation problem may be reduced.

Figure 4D:
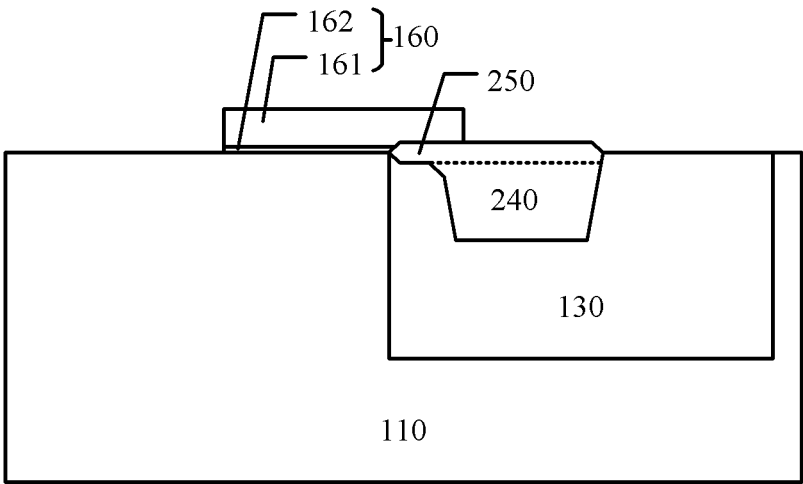

At S16, the gate structure can be formed. In FIG. 4D, gate structure 160 can be formed on the semiconductor substrate including field oxide layer 250 and shallow trench isolation region 240. In this particular example, the thickness of gate oxide layer 162 of gate structure 160 can be less than that of field oxide layer 250, and polysilicon layer 161 can also cover the junction between field oxide layer 250 and shallow trench isolation region 240.

For example, a thin oxide layer can be deposited on semiconductor substrate 110 before the depositing of the silicon nitride layer, and thickness of the thin oxide layer can be consistent with (e.g., the same as) a thickness of gate oxide layer 162. The etched silicon nitride layer can also cover gate oxide layer 162. By subsequently further using the silicon nitride layer as a mask, the oxidation process may increase the thickness of part of the thin oxide layer to obtain a target thickness of field oxide layer 250. This can be followed by removing the silicon nitride layer, and etching the thin oxide layer, in order to expose other regions (e.g., source region and drain region, etc.) on the upper surface of semiconductor substrate 110. This can accommodate subsequent fabrication of a source electrode connecting to the source region and a drain electrode connecting to the drain region.

In particular embodiments, a method of manufacturing can include a combination structure of a horizontal oxide layer structure and a vertical oxide layer structure of the semiconductor device. The manufacturing process of other layer structures of LDMOS devices or other semiconductor devices are not limited therefrom. Particular embodiments are not limited to high-voltage LDMOS devices, but can also be used for other low-voltage MOS devices. Particular embodiments can ensure the thickness reliability of field oxide layers of various thicknesses, while ensuring the design reliability of breakdown voltage. The horizontal oxide layer structure may not be limited to high-voltage field oxide layers of high thickness, and is also applicable to horizontal oxide layers such as field oxide layer or gate oxide layer with any thickness.

Figure 5:
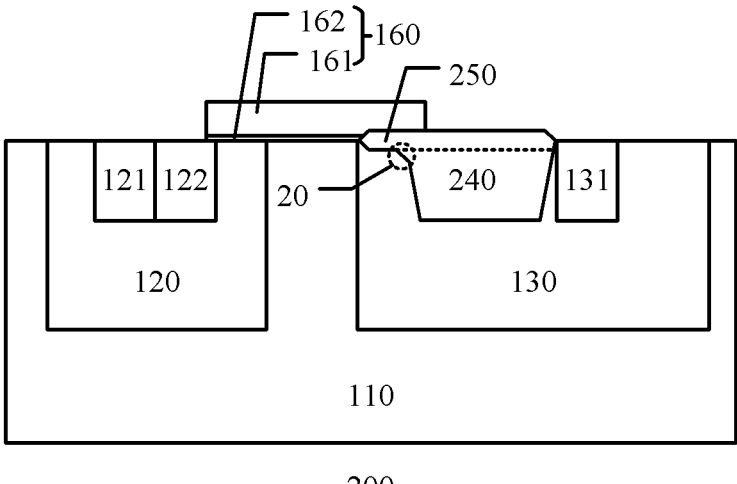
FIG. 5 is a structural diagram of the example semiconductor device, in accordance with embodiments of the present invention.

Referring now to FIG. 5, shown is a structural diagram of the example semiconductor device, in accordance with embodiments of the present invention. In this particular example, junction structure 20 between field oxide layer 250 and shallow trench isolation region 240 formed by the manufacturing method of the semiconductor device of the present disclosure is a smooth structure. The thickness of field oxide layer 250 can be guaranteed, and the smooth structure may not be prone to the accumulation of charge, and can further reduce the breakdown risk of field oxidation layer 250 and improve the breakdown voltage of semiconductor device 200.

In an example n-type LDMOS device, semiconductor substrate 110 of semiconductor device 200 is p-type substrate, body region 120 is p-type well region, drift region 130 is n-type well region, base region 121 is p-type doped, source region 122 is n-type doped, and drain region 131 is n-type doped. The semiconductor device can include a gate structure, which can include polysilicon layer 161 and gate oxide layer 162. For example, the junction between the field oxide layer structure and the shallow trench isolation structure can be covered with a gate structure.

The manufacturing method of the semiconductor device in particular embodiments can include depositing oxides in the trench to form the vertical oxide layer structure, and then etching the vertical oxide layer structure from its upper surface to decrease height of the vertical oxide layer structure and make its top surface be below the upper surface of the semiconductor substrate to expose side surfaces of the trench. In a subsequent oxidation process, the upper surface and the side surfaces at the junction of the horizontal oxide layer structure and the vertical oxide layer structure can be oxidized simultaneously to form a smooth corner. This example method can reduce the influence of a sharp corner caused by incomplete oxidation of junction structures on the thickness of horizontal oxide structures, thereby the thickness uniformity of horizontal oxide structures can be improved, the breakdown protection effect of horizontal oxide structure may be improved, and the performance of semiconductor device can be improved.

In particular embodiments, the semiconductor device formed by the example manufacturing method can result in the junction of the horizontal oxide layer structure and the vertical oxide layer structure being relatively smooth. Also, the influence of a sharp corner caused by incomplete oxidation of junction structures on the thickness of horizontal oxide structures can be reduced, and the thickness uniformity of the horizontal oxide layer structure may be guaranteed. As a result, the breakdown protection effect of horizontal oxide structure can be improved, as well as the performance of the semiconductor device.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of manufacturing making a semiconductor device having a combination structure of a horizontal oxide layer structure and a vertical oxide layer structure, the method comprising:

a) etching from an upper surface of a semiconductor substrate to inside of the semiconductor substrate to form a trench;

b) depositing an oxide in the trench to form a vertical oxide structure;

c) etching the vertical oxide structure from an upper surface thereof to decrease a height of the vertical oxide structure to form the vertical oxide layer structure, and to make a top surface of the vertical oxide layer structure be below the upper surface of the semiconductor substrate, in order to expose side surfaces of the trench;

d) forming, by an oxidation process, the horizontal oxide layer structure to cover a part of the upper surface of the semiconductor substrate and the upper surface of the vertical oxide layer structure; and e) wherein at a first side of the combination structure whereby the horizontal oxide layer structure extends horizontally beyond the vertical oxide layer structure, a junction between the horizontal oxide layer structure and the vertical oxide layer structure is smoother than a junction between the upper surface of the semiconductor substrate and the combination structure at a second side opposite the first side.

2. The method of claim 1, wherein the side surfaces of the trench are tilted outwards, and an inclination angle of each side surface to a bottom surface of the trench differs from 90 degrees.

3. The method of claim 2, wherein the shape of the vertical section of the trench is an inverted trapezoid, and the inclination angle is between 65 degrees and 70 degrees.

4. The method of claim 1, wherein during the etching of the vertical oxide layer structure, the vertical oxide structure is etched by a wet etching process.

5. The method of claim 1, wherein in the etching of the vertical oxide structure, the top surface of the vertical oxide layer structure after the etching is between 100 angstroms and 400 angstroms lower than the upper surface of the semiconductor substrate.

6. The method of claim 1, wherein the oxidation process used to form the horizontal oxide layer structure comprises a LOCOS process.

7. The method of claim 1, further comprising forming a gate structure covering the junction between the horizontal oxide layer structure and the vertical oxide layer structure.

8. The method of claim 7, further comprising forming a laterally diffused metal oxide semiconductor (LDMOS) device.

9. The method of claim 8, wherein the vertical oxide layer structure comprises a shallow trench isolation structure, and the horizontal oxide layer structure comprises a field oxide layer structure.

10. The method of claim 9, wherein a junction between the field oxide layer structure and the shallow trench isolation structure is covered with the gate structure.

11. The method of claim 9, wherein a shape of a vertical section of the shallow trench isolation structure is an inverted trapezoid, and an inclination angle of each side surface to a bottom surface of the trench is between 65 degrees and 70 degrees.

* * * * *